US008586462B2

(12) United States Patent
Ahn et al.

(10) Patent No.: US 8,586,462 B2
(45) Date of Patent: Nov. 19, 2013

(54) METHOD OF MANUFACTURING A FIELD-EFFECT TRANSISTOR

(75) Inventors: Hokyun Ahn, Daejeon (KR); Jong-Won Lim, Daejeon (KR); Hyung Sup Yoon, Daejeon (KR); Byoung-Gue Min, Daejeon (KR); Sang-Heung Lee, Daejeon (KR); Hae Cheon Kim, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 75 days.

(21) Appl. No.: 13/307,069

(22) Filed: Nov. 30, 2011

(65) Prior Publication Data

US 2012/0153361 A1   Jun. 21, 2012

(30) Foreign Application Priority Data

Dec. 17, 2010   (KR) .................. 10-2010-0130291

(51) Int. Cl.
*H01L 29/808* (2006.01)
*H01L 21/283* (2006.01)

(52) U.S. Cl.
USPC ........... 438/586; 438/285; 438/478; 438/587; 438/E21.159; 257/192; 257/194; 257/259

(58) Field of Classification Search
USPC ................. 438/186, 197, 285, 478, 586–590; 257/192, 194, 256, 288, E21.159, 257/E29.312
See application file for complete search history.

(56) References Cited

U.S. PATENT DOCUMENTS

| 7,573,078 B2 | 8/2009 | Wu et al. |
| 2005/0253168 A1 | 11/2005 | Wu et al. |
| 2006/0011915 A1* | 1/2006 | Saito et al. ............ 257/65 |

FOREIGN PATENT DOCUMENTS

| KR | 10-0244411 B1 | 11/1999 |
| KR | 10-0276077 B1 | 9/2000 |
| KR | 10-0782430 B1 | 11/2007 |
| KR | 2008-0036002 A | 4/2008 |

OTHER PUBLICATIONS

Eldad Bahat-Treidel et al., "AlGaN/GaN/AlGaN DH-HEMTs Breakdown Voltage Enhancement Using Multiple Grating Field Plates (MGFPs)", IEEE Transactions on Electron Devices, vol. 57, No. 6, pp. 1208-1216, Jun. 2010.
Eizo Mitani et al., "Mass-Production of High-Voltage GaAs and GaN Devices", CS MANTECH Conference, Apr. 24-27, 2006.
A. Chini et al., "Power and Linearity Characteristics of Field-Plated Recessed-Gate AlGaN-GaN HEMTs", IEEE Electron Device Letters, vol. 25, No. 5, pp. 229-231, May 2004.

* cited by examiner

*Primary Examiner* — Dung A. Le
(74) *Attorney, Agent, or Firm* — Rabin & Berdo, P.C.

(57) ABSTRACT

Disclosed are a method of manufacturing a field-effect transistor. The disclosed method includes: providing a semiconductor substrate; forming a source ohmic metal layer on one side of the semiconductor substrate; forming a drain ohmic metal layer on another side of the semiconductor substrate; forming a gate electrode between the source ohmic metal layer and the drain ohmic metal layer, on an upper portion of the semiconductor substrate; forming an insulating film on the semiconductor substrate's upper portion including the source ohmic metal layer, the drain ohmic metal layer and the gate electrode; and forming a plurality of field electrodes on an upper portion of the insulating film, wherein the insulating film below the respective field electrodes has different thicknesses.

9 Claims, 8 Drawing Sheets

<PRIOR ART>

<PRIOR ART>

<PRIOR ART>

<PRIOR ART>

<PRIOR ART>

<PRIOR ART>

<PRIOR ART>

<PRIOR ART>

METHOD OF MANUFACTURING A FIELD-EFFECT TRANSISTOR

CROSS-REFERENCE TO RELATED APPLICATIONS

This application is based on and claims priority from Korean Patent Application No. 10-2010-0130291, filed on Dec. 17, 2010, with the Korean Intellectual Property Office, the disclosure of which is incorporated herein in its entirety by reference.

BACKGROUND OF THE INVENTION

1. Field of the Invention

The present invention relates to a transistor, and more particularly to a field-effect transistor and a manufacturing method thereof, in which a separate lithography process and its corresponding additional process are not required, and insulating films below field electrodes have different thicknesses.

2. Description of the Prior Art

FIGS. 1A to 1H are views illustrating a method for manufacturing a field-effect transistor, according to a prior art.

As shown in FIG. 1A, on a semiconductor substrate 10 including gallium nitride (GaN), silicon (Si), silicon carbide (SiC), semi-insulating gallium arsenide (GaAs), etc., an active layer 11 and a cap layer 12 are sequentially formed. For example, in a case of a high electron mobility transistor (HEMT) element using hetero junction of aluminum gallium nitride (AlGaN) and gallium nitride (GaN), the active layer 11 includes a gallium nitride buffer layer and an aluminum gallium nitride barrier layer, and the cap layer 12 includes a gallium nitride (GaN) layer.

As shown in FIG. 1B, a region where a source•drain ohmic metal layer 13 is to be formed is defined as a source•drain pattern. On the upper surface of the cap layer 12, an ohmic metal is deposited and then the source•drain ohmic metal layer 13 is formed through rapid thermal annealing (RTA), etc. For example, in a manufacturing process of an HEMT element using a gallium nitride (GaN)-based compound semiconductor, as an ohmic metal, a metal layer formed by sequentially depositing a Ti film, an Al film, a Ni film, an Au film, etc. with a predetermined thickness is used. In a process of manufacturing an HEMT element, a metal semi-conductor field effect transistor (MESFET), or the like by using a gallium arsenide (GaAs)-based compound semiconductor, a metal layer formed by sequentially depositing an AuGe film, a Ni film, an Au film, etc. with a predetermined thickness is used as an ohmic metal.

As shown in FIG. 1C, on the cap layer 12 which has been subjected to an ohmic process, a photosensitive film is coated, and then gate patterns 14a, 14b and 14c formed with a T-shaped hole 15a are formed by using optical lithography, e-beam lithography or the like. Herein, the gate patterns 14a, 14b and 14c are used to manufacture a T-shaped gate electrode while reducing a gate width without an increase in a resistance of a gate electrode.

As shown in FIG. 1D, a gate recess process for etching the cap layer 12 exposed through the T-shaped hole 15a is performed so as to form a gate recess region 15b to be deposited with a gate metal. Herein, the gate recess process is the most critical step in manufacturing of an HEMT element or an MESFET element using a compound semiconductor, and is generally performed while measuring a current. Also, the process includes one or more steps including a wet process, a dry process or a combination of the wet and dry processes.

The gate recess process is performed using a gas such as $CF_4$, $BCl_3$, $Cl_2$ and $SF_6$ in an apparatus for dry etching such as an electron cyclotron resonance (ECR) or inductive coupled plasma (ICP). Herein, the process is carried out by using various wet etching solutions such as a phosphoric acid-based solution in which $H_3PO_4$, $H_2O_2$ and $H_2O$ applied to a gallium arsenide (GaAs)-based compound semiconductor element are mixed at a predetermined ratio.

As shown in FIG. 1E, a gate metal is deposited on the gate patterns 14a, 14b, and 14c, and the gate patterns 14a, 14b, and 14c are removed by a lift-off process, thereby forming a T-shaped gate electrode 16. For example, in the manufacturing process of the HEMT element using a gallium nitride (GaN)-based compound semiconductor, the gate electrode 16 is formed by sequentially depositing metal layers such as a Ni film, and an Au film to a predetermined thickness. In the manufacturing process of an HEMT element, an MESFET element, or the like using a gallium arsenide (GaAs)-based compound semiconductor, the gate electrode 16 is formed by sequentially depositing metal layers such as a Ti film, a Pt film, an Au film, etc. to a predetermined thickness.

As shown in FIG. 1F, after the gate electrode 16 is formed, on the cap layer 12's upper portion including the source•drain ohmic metal layer 13 and the T-shaped gate electrode 16, an insulating film 17 is deposited. Then, as shown in FIG. 1G, through the performance of a lithography process for forming a field electrode, a field electrode pattern 18 is formed.

As shown in FIG. 1H, after a metal is deposited on the field electrode pattern 18 for forming a field electrode, and the field electrode pattern 18 is removed by a lift-off process, thereby forming a plurality of field electrodes 19. In this case, for the plurality of field electrodes 19, the thickness of the insulating film 17 below the field electrodes 19 is fixed as a predetermined thickness. In a case where the thickness of the insulating film 17 below each of the field electrodes 19 is adjusted, a separate mask pattern for each of the field electrodes 19 is required and thus, a lithography process, an etching process, a metal-deposition process and a lift-off process are performed.

As described above, in a case of a conventional field-effect transistor including a field electrode, and a manufacturing method thereof, in manufacturing of the field electrode, a peak value may be reduced through field reduction in a region of a gate and a drain. Furthermore, it is possible to achieve a high breakdown voltage through a reduction of leakage current of a gate while maintaining high frequency performance and also it is expected that it is possible to reduce a capacitance between a gate and a drain through a shielding effect. Accordingly, it is possible to manufacture a power device which is capable of being driven at high voltage and high current.

However, in the case of a field-effect transistor including a field electrode, the thickness of an insulating film below field electrodes on one substrate is generally fixed. Thus, in order to adjust the thickness of the insulating film, a separate mask pattern is required for each of the field electrodes. Furthermore, for respective mask patterns, a lithography process, an etching process, a metal-deposition process, and a lift-off process have to be repeatedly performed.

For example, in an HEMT element manufactured using a compound semiconductor including GaN, GaAs, InP, etc., one or more field electrodes, besides a gate, are manufactured between a source and a drain. In the field electrodes manufactured using a mask pattern for forming the field electrodes, the thickness of an insulating film below the field electrodes on one substrate is generally fixed. Thus, in order to adjust the thickness of the insulating film below each of the field electrodes, a separate mask pattern is required for each of the field electrodes. Furthermore, for respective mask patterns, a lithography process, an etching process, a metal-deposition process, and a lift-off process have to be repeatedly performed.

Accordingly, in a case of a conventional manufacturing method of a field-effect transistor including a field electrode, it is impossible to apply different thicknesses of an insulating film below field electrodes, to the same element. Even when the thickness of an insulating film below field electrodes can be varied, a separate mask pattern is required for each of the field electrodes. Furthermore, for respective mask patterns, a lithography process, an etching process, a metal-deposition process and a lift-off process have to be repeatedly performed. This causes a problem such as an increase in a unit cost of a manufacturing process and a reduction of productivity.

SUMMARY OF THE INVENTION

Accordingly, the present invention has been made to solve the above-mentioned problems occurring in the prior art, and an object of the present invention is to provide a field-effect transistor and a manufacturing method thereof, in which a separate lithography process and its corresponding additional process are not required and an insulating film below field electrodes can have different thicknesses.

In order to accomplish this object, there is provided a method for manufacturing a field-effect transistor, the method including: a main electrode forming step for forming a source, a drain and a gate electrode on an upper portion of a semiconductor substrate; an insulating film depositing step for depositing an insulating film on the semiconductor substrate's upper portion including the source, the drain, and the gate electrode; a field electrode pattern forming step for forming a multi-layered field electrode pattern having different exposure layers of openings by depositing multi-layered photosensitive films on an upper portion of the insulating film and patterning the films; an insulating film etching step for performing an insulating film etching process using the field electrode pattern as an etching mask so that the insulating film has different stepped heights; and a field electrode forming step for depositing a metal layer by using the field electrode pattern and forming field electrodes on the upper portion of the insulating film having the different stepped heights through performance of a lift-off process.

In accordance with another aspect of the present invention, there is provided a field-effect transistor including: a semiconductor substrate; a source ohmic metal layer formed on one side of the semiconductor substrate; a drain ohmic metal layer formed on another side of the semiconductor substrate; a gate electrode formed between the source ohmic metal layer and the drain ohmic metal layer, on an upper portion of the semiconductor substrate; an insulating film formed on the semiconductor substrate's upper portion including the source ohmic metal layer, the drain ohmic metal layer and the gate electrode; and a plurality of field electrodes formed on an upper portion of the insulating film, wherein the insulating film below the respective field electrodes has different thicknesses.

In a field-effect transistor including a plurality of field electrodes, according to the present invention, it is possible to adjust characteristics of the insulating film below the field electrodes by adjusting the thickness of the insulating film below the respective field electrodes. Accordingly, it is possible to apply various biases to the respective field electrodes, thereby improving the breakdown voltage characteristic of an element. Accordingly, it is possible to manufacture a power device which can achieve high power when driven at high voltage.

Also, since separate additional masks are not required in manufacturing of the plurality of field electrodes, it is possible to manufacture high-performance transistors with improved productivity, increased uniformity and increased reproducibility, compared to a conventional process.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, an embodiment of the present invention will be described in detail with reference to the accompanying drawings. The configuration and operation effects of the present invention will be clearly understood through the detailed description as below.

FIGS. 2A to 2I are views illustrating a method for manufacturing a field-effect transistor according to one embodiment of the present invention.

Figure 1A:
FIGS. 1A to 1H are views illustrating a method for manufacturing a field-effect transistor according to a prior art.
Figure 1B:
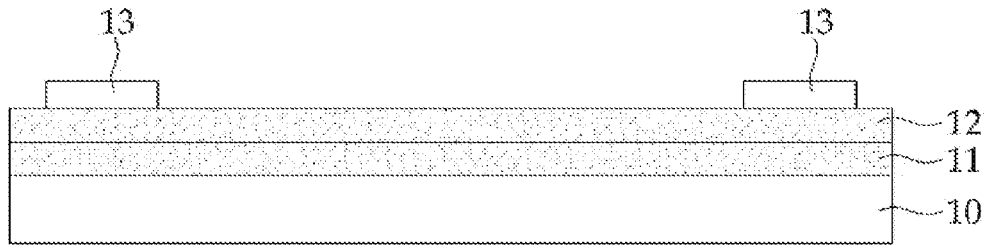
Figure 1C:
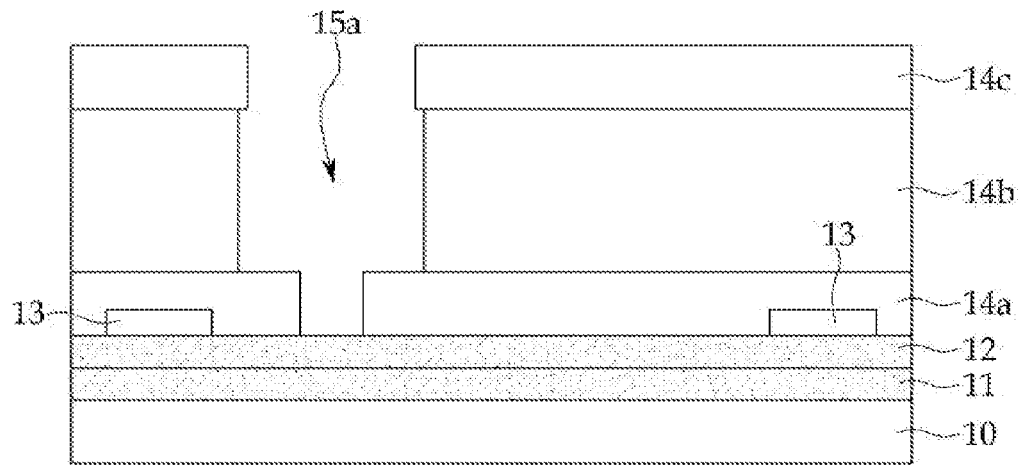
Figure 1D:
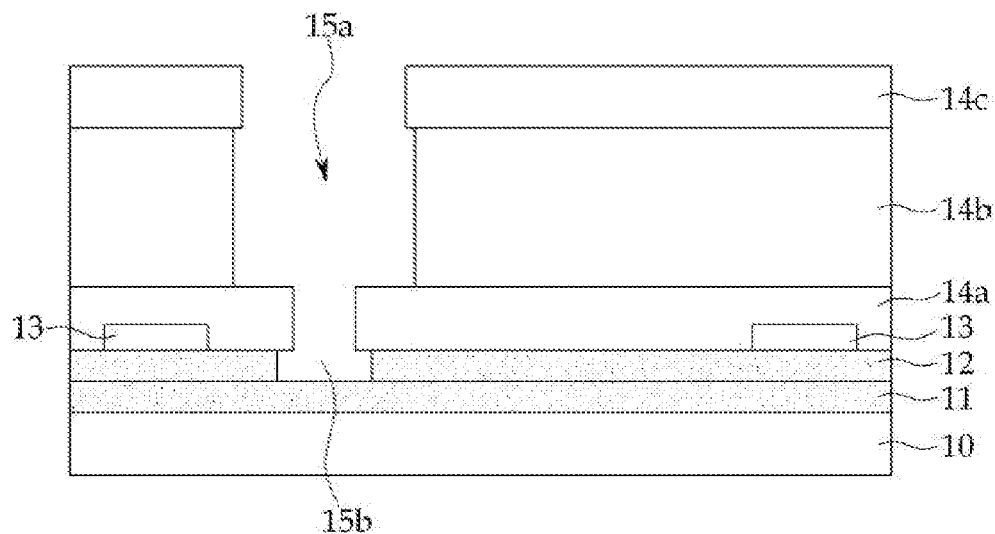
Figure 1E:
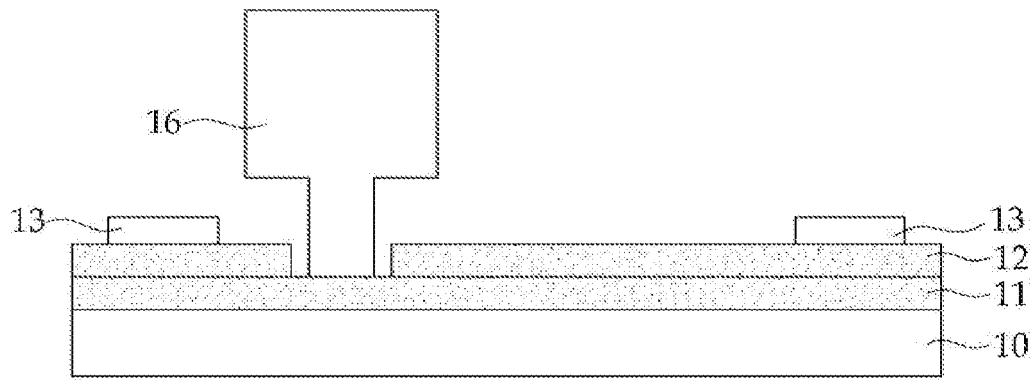
Figure 1F:
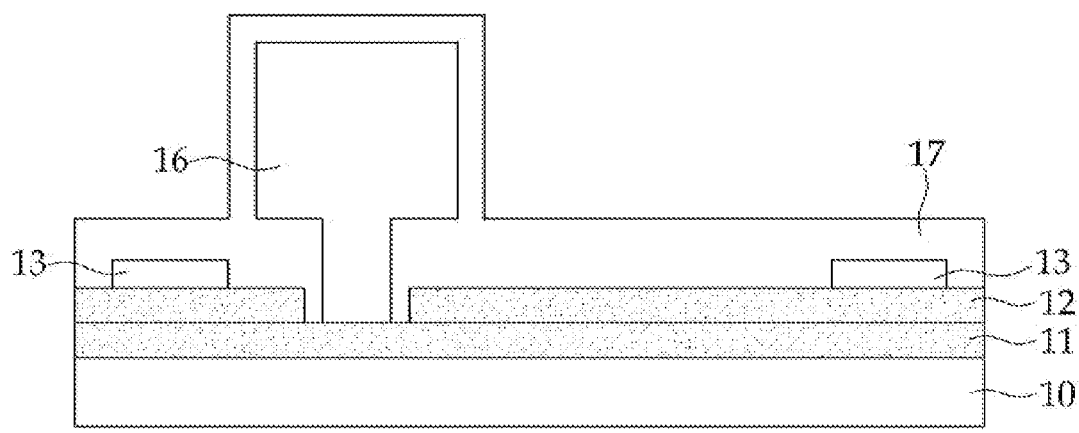
Figure 1G:
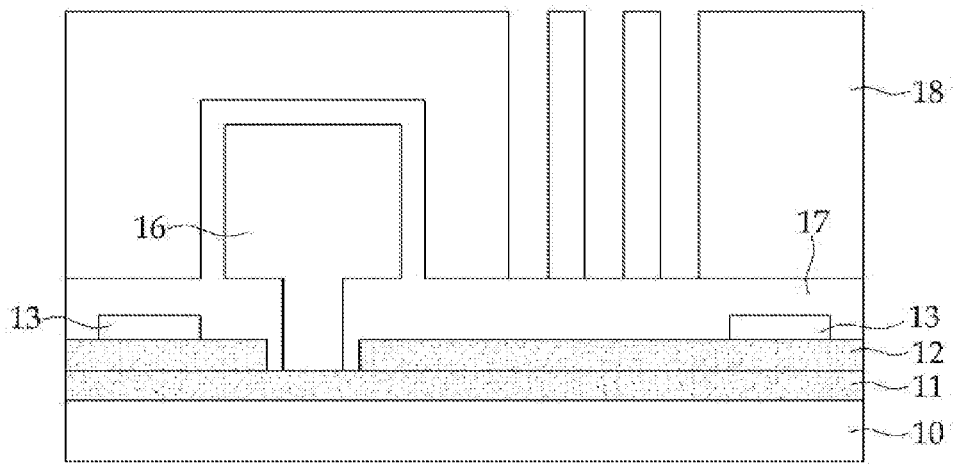
Figure 1H:
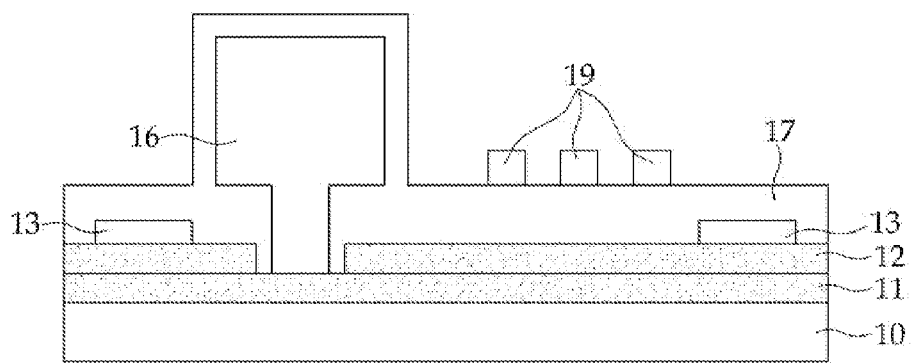
Figure 2A:
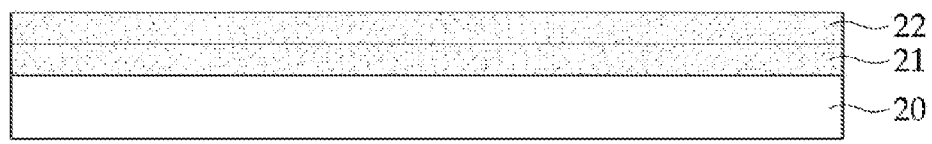
FIGS. 2A to 2I are views illustrating a method for manufacturing a field-effect transistor according to one embodiment of the present invention.
Figure 2B:
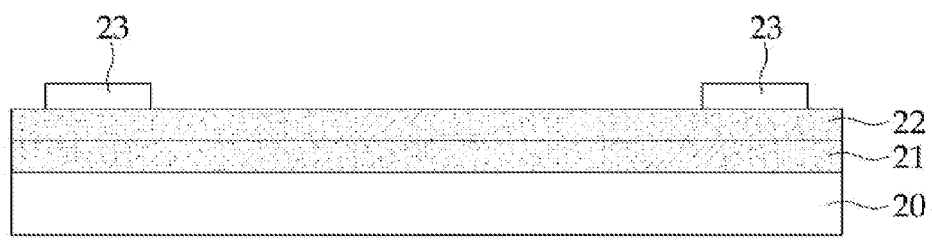

As shown in FIG. 2A, on a semiconductor substrate 20, an active layer 21 and a cap layer 22 are sequentially formed. As shown in FIG. 2B, a region where a source•drain ohmic metal layer 23 is to be formed is defined as a source•drain pattern, which is deposited with an ohmic metal, and then is formed with the source•drain ohmic metal layer 23 through rapid thermal annealing (RTA), etc. Herein, in a manufacturing process of a high electron mobility transistor (HEMT) element using a gallium nitride (GaN)-based compound semiconductor, as an ohmic metal, a metal layer formed by sequentially depositing a Ti film, an Al film, a Ni film, an Au film, etc. with a predetermined thickness may be used. In a manufacturing process of an HEMT element, a metal semiconductor field effect transistor (MESFET) element, or the like using a gallium arsenide (GaAs)-based compound semiconductor, as an ohmic metal, a metal layer formed by sequentially depositing an AuGe film, a Ni film, an Au film, etc. with a predetermined thickness may be used. Then, a source•drain ohmic metal layer may be formed through an RTA process.

Figure 2C:
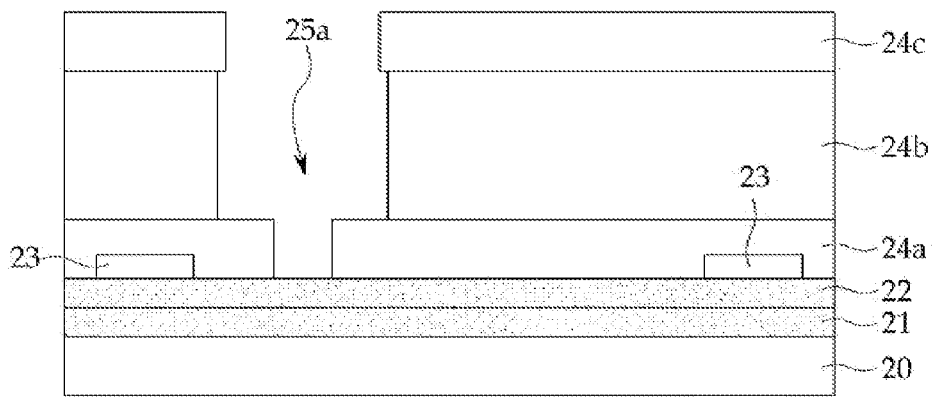

Then, as shown in FIG. 2C, on the cap layer 22 which has been subjected to an ohmic process, a photosensitive film is coated, and then gate patterns 24a, 24b and 24c formed with a T-shaped hole 25a are formed by using optical lithography, e-beam lithography or the like.

Figure 2D:
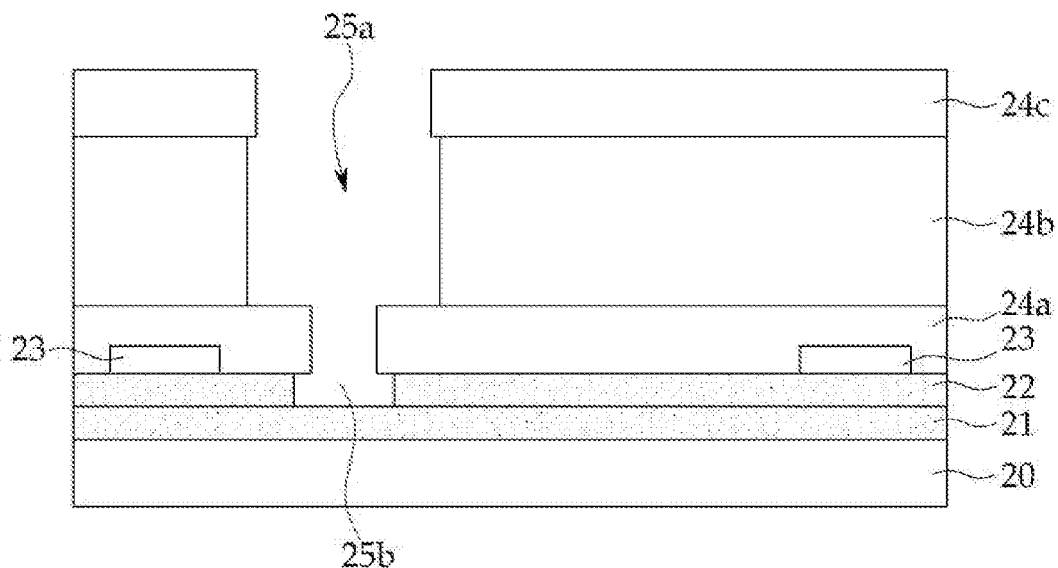

As shown in FIG. 2D, a gate recess process for etching the cap layer 22 exposed through the T-shaped hole 25a is performed so as to form a gate recess region 25b to be deposited with a gate metal. The gate recess process is the most critical step in an HEMT element or an MESFET element using a compound semiconductor and is generally performed while measuring a current. Also, the process includes one or more steps including a wet process, a dry process, or a combination of the wet and dry processes. The gate recess process may be performed using a gas such as $CF_4$, $BCl_3$, $Cl_2$ and $SF_6$ in an apparatus for dry etching such as an electron cyclotron resonance (ECR) or inductive coupled plasma (ICP). Herein, the process is carried out by using various wet etching solutions such as a phosphoric acid-based solution in which $H_3PO_4$, $H_2O_2$ and $H_2O$ applied to a gallium arsenide (GaAs)-based compound semiconductor element are mixed at a predetermined ratio.

Figure 2E:
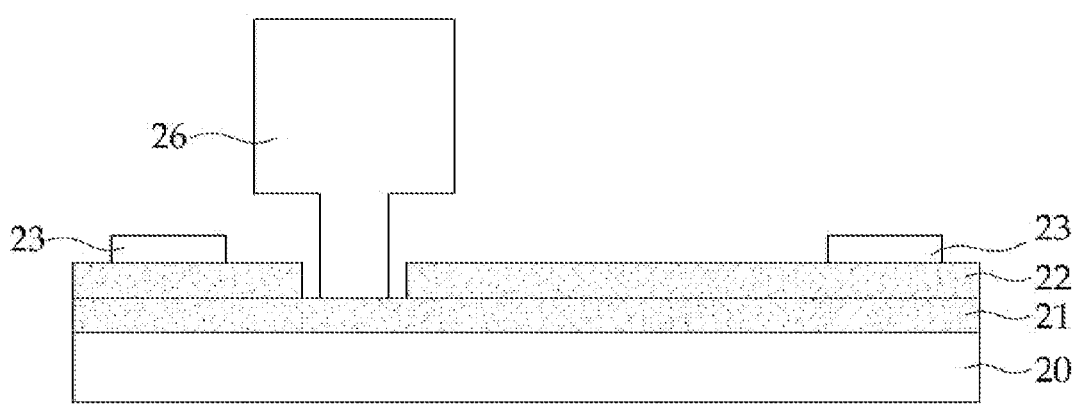

As shown in FIG. 2E, a gate metal is deposited on the gate patterns 24a, 24b and 24c, and the gate patterns 24a, 24b and 24c are removed by a lift-off process, thereby forming a T-shaped gate electrode 26. For example, in the manufacturing process of the HEMT element using a gallium nitride (GaN)-based compound semiconductor, the gate electrode 26 is formed by sequentially depositing metal layers such as a Ni film and an Au film to a predetermined thickness. In the manufacturing process of an HEMT element, an MESFET element, or the like using a gallium arsenide (GaAs)-based compound semiconductor, the gate electrode 26 is formed by sequentially depositing metal layers such as a Ti film, a Pt film, an Au film, etc. to a predetermined thickness.

Figure 2F:
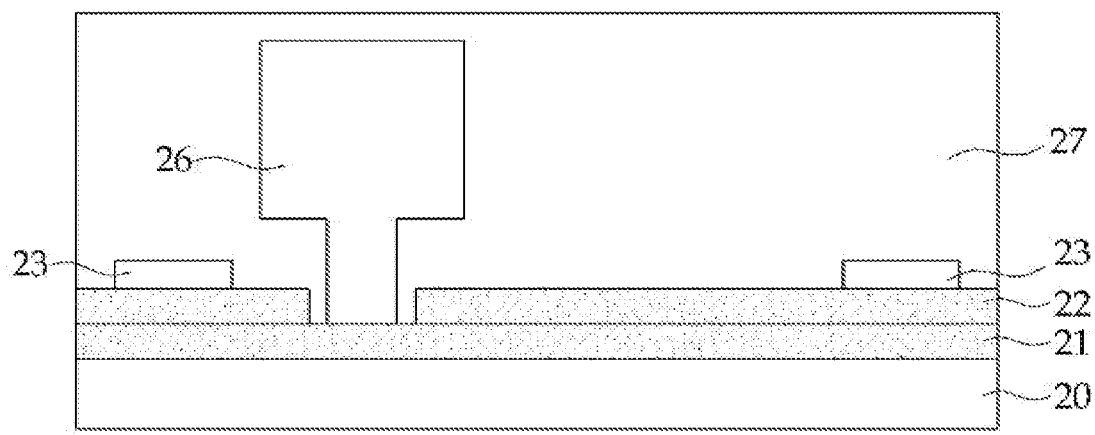

As shown in FIG. 2F, after the gate electrode 26 is formed, on the cap layer 22's upper portion including the source•drain ohmic metal layer 23 and the gate electrode 26, an insulating film 27 is deposited in one or more layers. Herein, the insulating film 27 may include a material such as silicon nitride, silicon oxide, BCB and a porous silica thin film, which protects the surface of the compound semiconductor substrate.

Then, the kind and the thickness of the insulating film 27 may be determined in consideration of an etch rate of the insulating film 27 and etch rates of photosensitive films in the lowest layer and its directly upper layer from among multi-layered photosensitive films, the photosensitive films constituting field electrode patterns 28a, 28b and 28c used as an etching mask in the insulating film 27's etching process as described below. In other words, it has to be adjusted in such a manner that the surface of the semiconductor substrate 20 is not exposed and the insulating film can be exposed through etching of the photosensitive films in an exposure area of the photosensitive films in the lowest layer or its directly upper layer of the field electrode patterns 28a, 28b and 28c in the etching process of the insulating film 27 as described below.

Figure 2G:
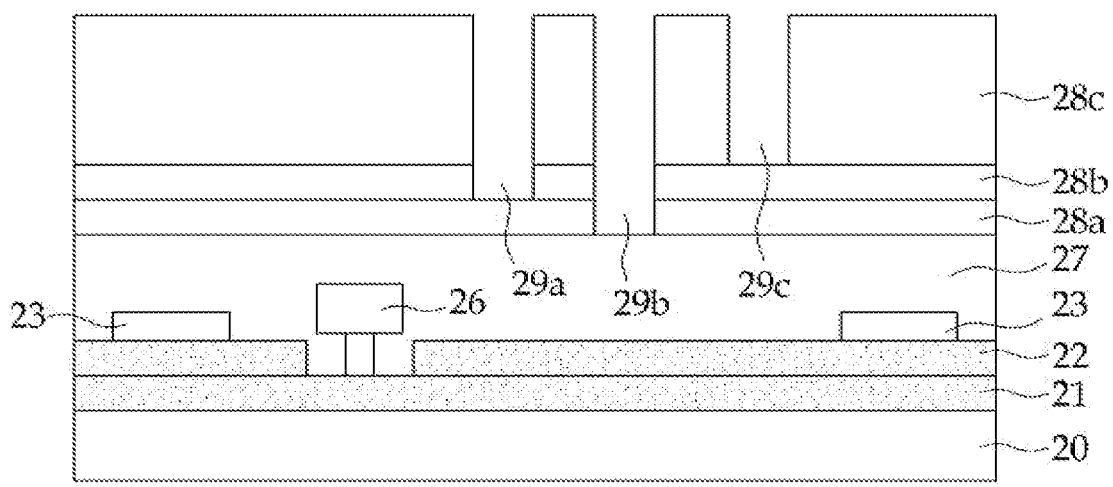

As shown in FIG. 2G, after the multi-layered photosensitive films are coated on the insulating film 27, the field electrode patterns 28a, 28b and 28c having different exposure layers of openings 29a, 29b and 29c are formed. According to one embodiment of the present invention, when three field electrodes are manufactured, triple or more field electrode patterns 28a, 28b, and 28c are required. Specifically, the field electrode patterns 28a 28b, and 28c are multi-layered photosensitive film patterns in which exposure layers of the openings 29a, 29b and 29c are the insulating film 27, the lowest photosensitive film 28a and its directly upper photosensitive film 28b, respectively. When the field electrode patterns 28a, 28b and 28c are manufactured by using e-beam lithography, various combinations of multi-layered photosensitive films such as PMMA/PMGI/Copolymer/PMMA or ZEP/PMGI/Copolymer/ZEP may be used. Herein, the kind and thickness of the lowest layer 28a (hereinafter, "a first photosensitive film") and its directly upper photosensitive film 28b (hereinafter, referred to as "a second photosensitive film") have to be selected in consideration of etch selectivity in such a manner that the insulating film 27 in exposure areas of the first photosensitive film 28a and the second photosensitive film 28b can be totally exposed during an etching process of single- or multi-layered insulating films on the semiconductor substrate 20.

Figure 2H:
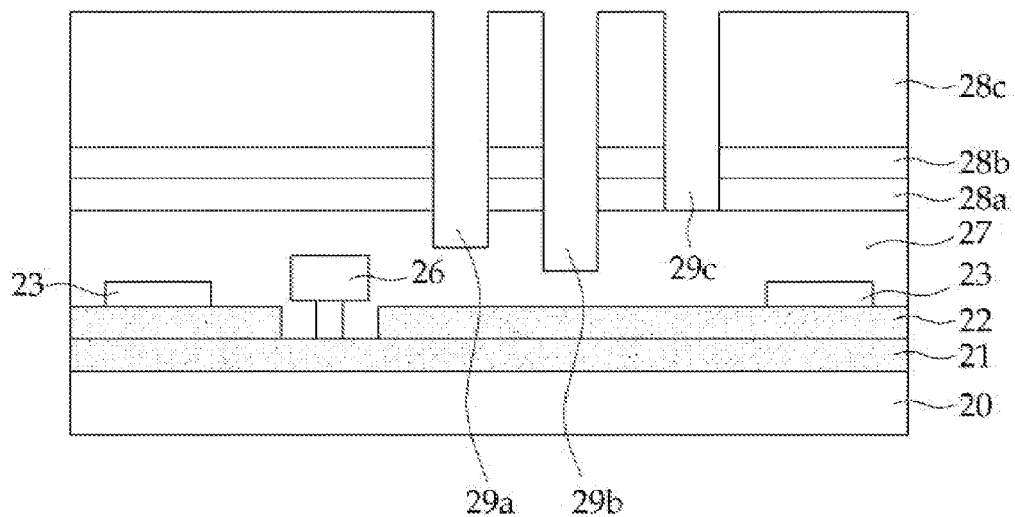

As shown in FIG. 2H, through the performance of an insulating film etching process using, as an etching mask, field electrode patterns 28a, 28b and 28c for manufacturing field electrodes, the insulating film 27 has different depths.

In a case of dry etching, the insulating film etching process may be performed in an apparatus for dry etching such as reactive ion etching (RIE), magnetically enhanced reactive ion etching (MERIE) and ICP, while in a case of wet etching, the process may be performed by using a buffered oxide etch (BOE) solution, etc.

Figure 2I:
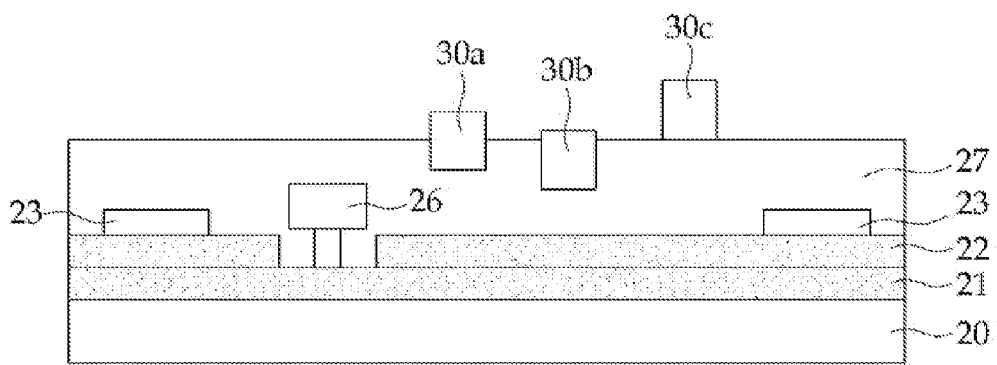

As shown in FIG. 2I, a metal layer for field electrodes is deposited by using the field electrode patterns 28a, 28b and 28c for manufacturing the field electrodes and then a lift-off process is performed so as to manufacture a plurality of field electrodes 30a, 30b and 30c.

Accordingly, in one embodiment of the present invention, by adjusting the thickness of the insulating film 27 below the respective field electrodes 30a, 30b, and 30c, it is possible to adjust characteristics of the insulating film below the field electrodes. Accordingly, it is possible to apply various biases to the respective field electrodes, thereby improving the breakdown voltage characteristic of an element. Accordingly, it is possible to manufacture a power device which can achieve high power when driven at high voltage.

Also, since separate additional masks are not required in manufacturing of the plurality of field electrodes 30a, 30b and 30c, it is possible to manufacture high-performance transistors with improved productivity, increased uniformity and increased reproducibility, compared to a conventional process.

The embodiments disclosed in the specification of the present invention are not intended to limit the present invention. It should be appreciated that the scope of the present invention is defined by the claims as below and various technologies may be made within a scope equivalent to the scope of the present invention.

What is claimed is:

1. A method for manufacturing a field-effect transistor, the method comprising:
   a main electrode forming step for forming a source, a drain and a gate electrode on an upper portion of a semiconductor substrate;
   an insulating film depositing step for depositing an insulating film on the semiconductor substrate's upper portion comprising the source, the drain and the gate electrode;
   a field electrode pattern forming step for forming a multi-layered field electrode pattern having different exposure layers of openings by depositing multi-layered photosensitive films on an upper portion of the insulating film and patterning the films;
   an insulating film etching step for performing an insulating film etching process using the field electrode pattern as an etching mask so that the insulating film has different stepped heights; and
   a field electrode forming step for depositing a metal layer by using the field electrode pattern, and forming field electrodes on the upper portion of the insulating film having the different stepped heights through performance of a lift-off process.

2. The method as claimed in claim 1, wherein the insulating film comprises at least one selected from the group including silicon nitride, silicon oxide, $HfO_2$, BCB and a porous silica thin film.

3. The method as claimed in claim 1, wherein the insulating a kind and a thickness of the insulating film are determined in consideration of an etch rate of the insulating film and etch rates of the respective photosensitive films, except for an uppermost photosensitive film from among the multi-layered photosensitive films, in the insulating film etching process.

4. The method as claimed in claim 1, wherein kinds and thicknesses of the respective photosensitive films, except for an uppermost photosensitive film from among the multi-layered photosensitive films, are determined in consideration of etch selectivity in such a manner that the insulating film is exposed with the different stepped heights through the openings in the insulating film etching process.

5. The method as claimed in claim 1, wherein in the insulating film etching step, a dry etching process is performed by using an apparatus for any one of a reactive ion etching (RIE), a magnetically enhanced reactive ion etching (MERIE) and an inductive coupled plasma (ICP).

6. The method as claimed in claim 5, wherein in the dry etching process, any one of a $CF_4$ gas, a mixed gas of a $CF_4$ gas and a $CHF_3$ gas, and a mixed gas of a $CF_4$ gas and $O_2$ gas is used.

7. The method as claimed in claim 1, wherein in the insulating film etching step, a wet etching process is performed by using a buffered oxide etch (BOE) solution.

8. The method as claimed in claim 1, wherein in the field electrode pattern forming step, the field electrode pattern is formed by using e-beam lithography.

9. The method as claimed in claim 1, wherein the multi-layered photosensitive films comprise a combination of PMMA/PMGI/Copolymer/PMMA or ZEP/PMGI/Copolymer/ZEP.

* * * * *